United States Patent
Tsorng et al.

(10) Patent No.: US 11,369,044 B2
(45) Date of Patent: Jun. 21, 2022

(54) SERVER AIR-DUCT MODULE WITH CABLE-ROUTING CHANNEL

(71) Applicant: Quanta Computer Inc., Taoyuan (TW)

(72) Inventors: Yaw-Tzorng Tsorng, Taoyuan (TW); Tung-Hsien Wu, Taoyuan (TW); Shin-Ming Su, Taoyuan (TW); Hsiang-Pu Ni, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/949,779

(22) Filed: Nov. 13, 2020

(65) Prior Publication Data

US 2022/0159879 A1 May 19, 2022

(51) Int. Cl.
*H05K 7/14* (2006.01)
*H05K 7/20* (2006.01)

(52) U.S. Cl.
CPC ....... *H05K 7/20736* (2013.01); *H05K 7/1491* (2013.01); *H05K 7/20145* (2013.01)

(58) Field of Classification Search
CPC . G06F 1/185; G06F 1/20; G06F 1/186; G06F 1/183; G06F 13/409; G06F 1/206; H05K 7/20145; H01R 12/721; H01R 12/737; H01R 13/6587
USPC .... 361/695, 752, 801, 796, 690, 756, 679.4, 361/679.32, 719, 688, 679.51, 736, 720; 165/104.33
See application file for complete search history.

(56) References Cited

U.S. PATENT DOCUMENTS

| | | | |
|---|---|---|---|
| 6,478,284 B2 | 11/2002 | Qiu | |
| 6,643,131 B1 | 11/2003 | Huang | |
| 7,643,292 B1 | 1/2010 | Chen | |
| 7,796,385 B2 | 9/2010 | Yao et al. | |
| 2002/0039282 A1* | 4/2002 | Han | G11C 5/04 361/719 |
| 2005/0041392 A1* | 2/2005 | Chen | H05K 7/20727 361/695 |
| 2008/0068789 A1* | 3/2008 | Pav | H05K 7/20172 361/679.48 |
| 2008/0232066 A1* | 9/2008 | Wu | H05K 7/20727 361/690 |
| 2011/0014861 A1 | 1/2011 | Tsai et al. | |
| 2011/0052133 A1* | 3/2011 | Simmons | G02B 6/4455 385/135 |
| 2012/0020013 A1* | 1/2012 | Li | G06F 1/20 361/679.47 |

(Continued)

OTHER PUBLICATIONS

Office Action in U.S. Appl. No. 16/949,758 dated Nov. 22, 2021, 12 pp.

*Primary Examiner* — Mandeep S Buttar
(74) *Attorney, Agent, or Firm* — Nixon Peabody LLP

(57) ABSTRACT

An air-duct module for a server comprises a main body that includes an upper wall and a plurality of side walls extending downwardly away from the upper wall. The main body further includes a plurality of channel walls extending from the upper wall and defining a cable-routing channel located within the main body. The cable-routing channel receives an electronics cable that extends across the main body. The air-duct module has an air passage for guiding air across a heat exchanger within the server. The air-duct passage is defined by the upper wall, the plurality of side walls, and at least some of the plurality of channel walls.

19 Claims, 7 Drawing Sheets

(56) References Cited

U.S. PATENT DOCUMENTS

2013/0212846 A1     8/2013  Koenig
2013/0286584 A1*   10/2013  Lin .................... H05K 7/20181
                                                          361/695
2014/0146471 A1     5/2014  Liu
2021/0076532 A1*    3/2021  Sung .................. H05K 7/20009

* cited by examiner

SERVER AIR-DUCT MODULE WITH CABLE-ROUTING CHANNEL

FIELD OF THE INVENTION

The present invention relates generally to an air duct for delivering cooling air within a server, and more specifically, to an air-duct module that has integrated routing channels for receiving cables within the server.

BACKGROUND OF THE INVENTION

Server products contain various types of electronic equipment that are mounted on a server chassis. The server often includes numerous processors and/or memory devices, such as dual in-line memory modules ("DIMM" components). As the function of these electronics increases, the power consumption increases, leading to the generation of higher levels of waste heat. Furthermore, the physical space within server chassis is confined, such that there is limited volume for fans, air ducts, and cables/wires that connect the electronic equipment. As the market demands higher computing power and larger memory storage within smaller volumes, a need exists for components within the server that can efficiently remove heat and assist in routing the cables and wires that connect the various pieces of electronic equipment.

The present disclosure is directed to an improved air-duct module for a server that efficiently guides air across one or more heat exchangers, while also providing integrated channels to guide and retain the wires and cables that pass through the internal enclosure of the server.

SUMMARY OF THE INVENTION

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings and each claim.

According to one aspect of the present disclosure, an air-duct module for a server comprises a main body having a first end region for receiving air from a fan module and a second end region for allowing the air to exit from the air-duct module after moving across a heated component within the server. The main body has an upper wall extending between the first end region and the second end region, and a plurality of side walls extending downwardly away from the upper wall. The air-duct module further includes a cable-routing channel located within the main body. The cable-routing channel receives an electronics cable that extends from the first end region to the second end region.

According to a configuration of the above implementation, the cable-routing channel is recessed below the upper wall.

According to another configuration of the above implementation, the main body further includes a plurality of clamping structures located along the cable-routing channel for retaining the electronics cable within the cable-routing channel.

According to a further configuration of the above implementation, the plurality of clamping structures includes tabs projecting from the upper wall and partially across the cable-routing channel.

In a further aspect of the above implementation, the main body is comprised of a plurality of separate structures. The upper wall is defined by walls from the separate structures, and the cable-routing channel extends along the separate structures.

In yet a further aspect of the above implementation, the air-duct module further includes a second cable-routing channel for receiving a second electronics cable.

In another aspect of the above implementation, the second end region includes two separated outlets for permitting air to exit the air-duct module. One of the two separated outlets includes the cable-routing channel, and the other of the two separated outlets includes the second cable-routing channel.

According to a further configuration of the above implementation, the second cable-routing channel extends between the first end region and the second end region.

According to another configuration of the above implementation, the second cable-routing channel is located within the upper wall.

In yet a further aspect of the above implementation, the cable-routing channel is partially defined by a lower wall that faces downwardly away from the upper wall. The air-duct module further includes a plurality of support bosses extending from the lower surface for engaging corresponding support structures within the server.

In another aspect of the present disclosure, an air-duct module for a server comprises a main body that includes an upper wall and a plurality of side walls extending downwardly away from the upper wall. The main body further includes a plurality of channel walls extending from the upper wall and defining a cable-routing channel located within the main body. The cable-routing channel receives an electronics cable that extends across the main body. The air-duct module has an air passage for guiding air across a heat exchanger within the server. The air-duct passage is defined by the upper wall, the plurality of side walls, and at least some of the plurality of channel walls.

According to another aspect of the above implementation, the main body further includes a second plurality of channel walls defining a second cable-routing channel for receiving a second electronics cable.

According to a further aspect of the above implementation, at least some of the channel walls extend downwardly away from the upper wall.

According to yet a further aspect of the above implementation, at least some of the plurality of channel walls include support bosses for engaging corresponding support structures within the server.

According to another configuration of the above implementation, the main body further includes a plurality of clamping structures located along the cable-routing channel for retaining the electronics cable within the cable-routing channel.

According to another configuration of the above implementation, the main body has a first end region for receiving air from one or more fans and a second end region for allowing air to exit the air duct module in two air paths. One of the two air paths extends across the heat exchanger, and the other of the two air paths extends across a second heat exchanger.

In a further aspect of the present disclosure, a server comprises a chassis, electronics, at least one cable, a fan module, and an air-duct module. The chassis has a base and side walls extending upwardly from the base. The electronics are located within the chassis. At least one of the electronics is in direct thermal communication with a heat exchanger for removing heat from the at least one of the electronics. The cable is coupled to the electronics. The fan module is within the chassis and is for moving air across the heat exchanger. The air-duct module defines an air passage that guides the air from the fan module and across the heat exchanger. The air-duct module includes an integrated cable-routing channel that extends between a first end region near the fan module and a second end region near the heat exchanger. The cable is located within the integrated cable-routing channel of the air-duct module.

According to a further aspect of the above implementation, the air-duct module includes an upper wall and a plurality of side walls extending downwardly away from the upper wall toward the chassis. The heat exchanger is partially enveloped by the upper wall and at least one of the plurality of side walls.

According to yet a further aspect of the above implementation, the chassis includes a plurality of latches, and the air-duct module includes a plurality of slots that mate with the plurality of latches for mounting the air-duct module to the chassis.

According to another aspect of the above implementation, the air-duct module further includes a plurality of support bosses in the region of the integrated cable-routing channel. The plurality of support bosses engages corresponding components mounted to the chassis or to the chassis itself.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

Figure 1:
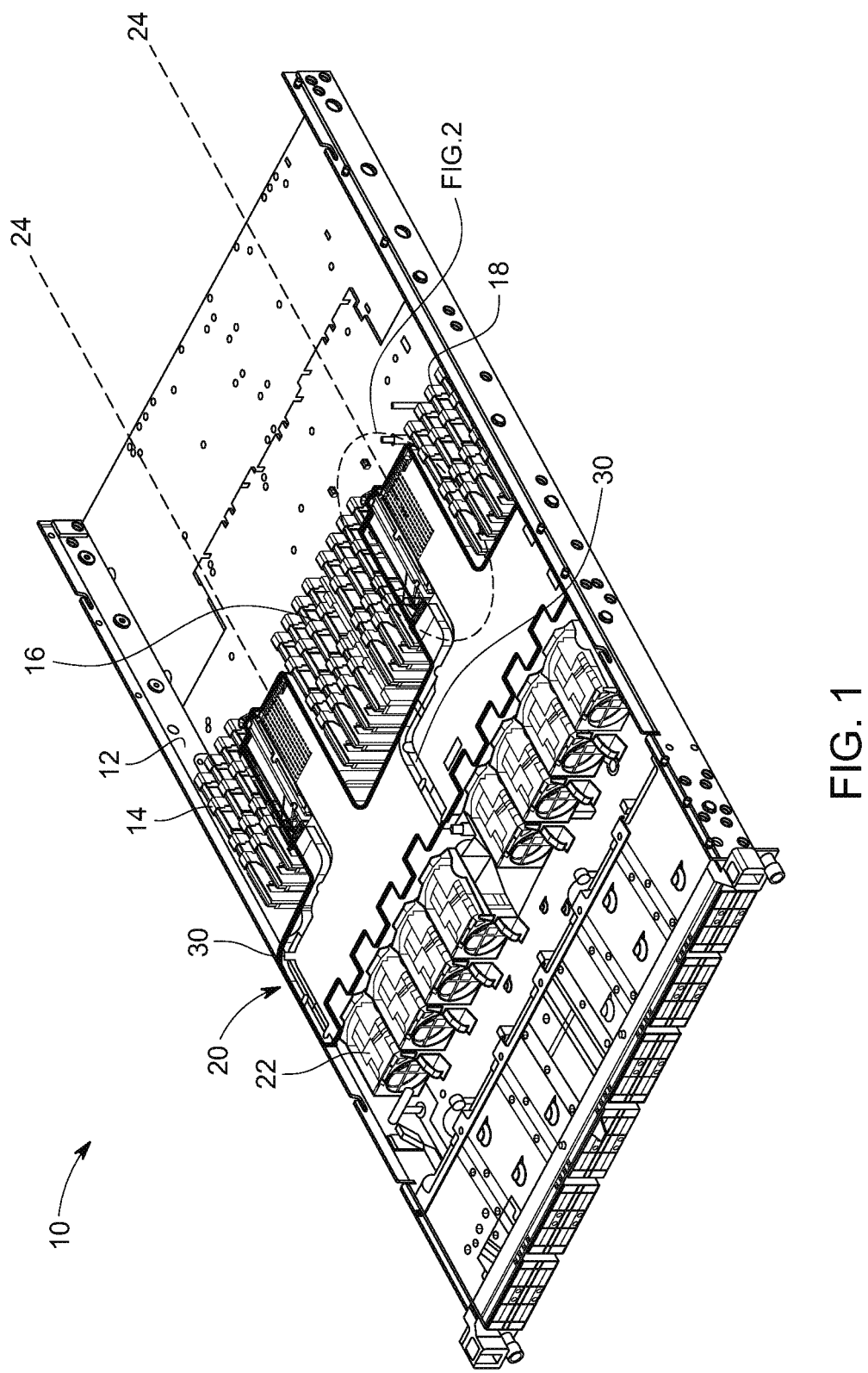
FIG. 1 is a perspective view of a server with an air-duct module having integrated cable-routing channels, in accordance with one embodiment of the present disclosure.

While the invention is susceptible to various modifications and alternative forms, specific implementations have been shown by way of example in the drawings and will be described in further detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Various embodiments are described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

FIG. 1 illustrates a perspective view of a server 10 having a chassis 12 that contains printed circuit boards (PCBs) and electronics at different locations within the chassis 12. In the embodiment of FIG. 1, electronics modules 14, 16, 18 are located in the middle region of the chassis 12 and include various components that create heat, such as memory storage devices and processors. In one embodiment, the electronics modules 14, 16, 18 are dual in-line memory modules (DIMM). When considering all of the various electronics within the server 10, some (e.g., processors) produce more waste and are more sensitive to temperature than other components, thereby requiring specific attention to maintain them at suitable operating temperatures. To do so, the server 10 includes an air-duct module 20 that guides air from a pair of fan modules 22 across a pair of heat exchangers 24. The heat exchangers 24 are in direct contact with the temperature-sensitive components, such that waste heat is transferred to the heat exchangers 24 via thermal conduction. The waste heat is ultimately removed from the heat exchangers 24 via thermal convection into the moving air. As shown, each fan module 22 includes four different fans that draw air into the server 10 via vents at the front of the chassis 12. It should be noted that although FIG. 1 illustrates two fan modules 22 with four fans in each fan module 22, the specific number of fans within each fan module 22 may be different and the number of fan modules 22 may be different.

Because the various PCBs and electronics (including electronic modules 14, 16, 18) must be interconnected, there are several cables and wires located within the server chassis 12 although they are not shown in FIG. 1. Some cables are required to electrically connect components located in front of and behind the air-duct module 20. To accommodate these cables, the air-duct module 20 includes integrated cable-routing channels 30, which are described in more detail below.

Figure 2:
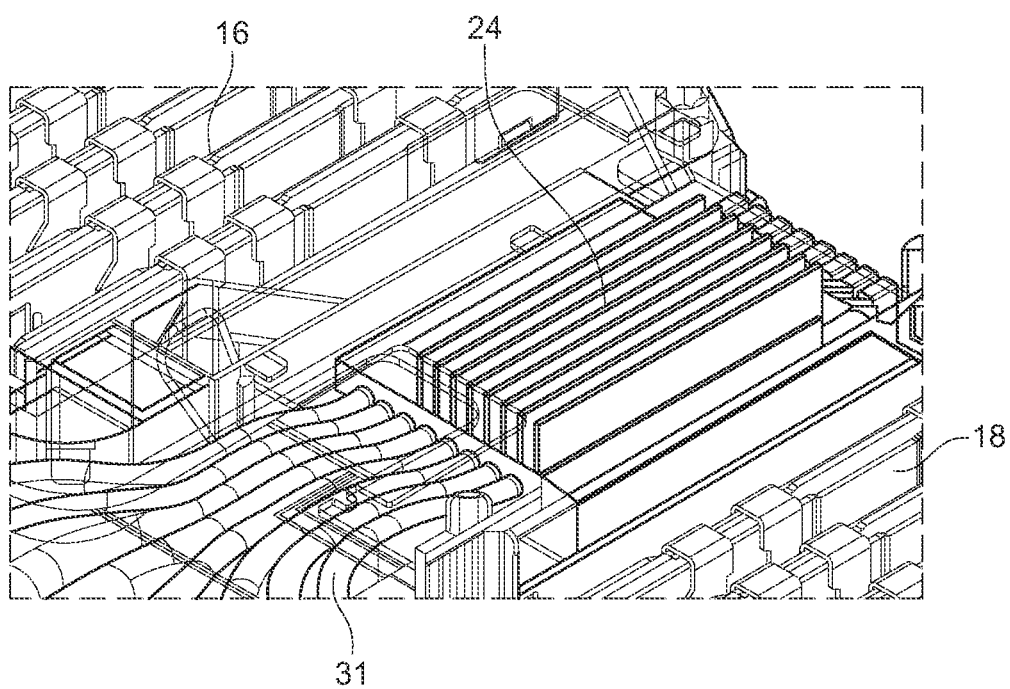
FIG. 2 is a detailed perspective view of the heat exchanger region that is enclosed by the air-duct module in FIG. 1.

FIG. 2 illustrates a more detailed view of the region of one of the heat exchangers 24 located between the electronic modules 16, 18 and below the air-duct module 20 in FIG. 1. For purposes of visualization, the air-duct module 20 is transparent in FIG. 2 to allow viewing of the details of the underlying region of the heat exchanger 24. The heat exchanger 24 receives waste heat from an electronic component (e.g., a processor) that is mounted on the backside of the heat exchanger 24 that is opposite of the heat exchanger fins such that it cannot be seen in FIG. 2. Though a single heat exchanger 24 is shown in the embodiment of FIG. 2, additional heat exchangers may be used with the air-duct module 20 of FIG. 1 in accordance with the present invention. For example, the temperature-sensitive component, such as the processor, may require multiple heat exchangers, such that a secondary heat exchanger (not shown) is positioned away from the heat exchanger 24. The secondary heat exchanger receives heat from the temperature-sensitive component via a plurality of conductive metal tubes 31 (e.g., copper tubes), which themselves act as small heat-exchanging surfaces that release waste heat into the moving air with the air-duct module 20 of FIG. 1.

Referring back to FIG. 1, the air-duct module 20 contacts and partially envelops the heat exchanger 24 to guide the moving air across the fins of the heat exchanger 24. The underside structures of the air-duct module 20 that help to guide the movement of the air are shown in more detail below with respect to FIG. 8.

Figure 3:
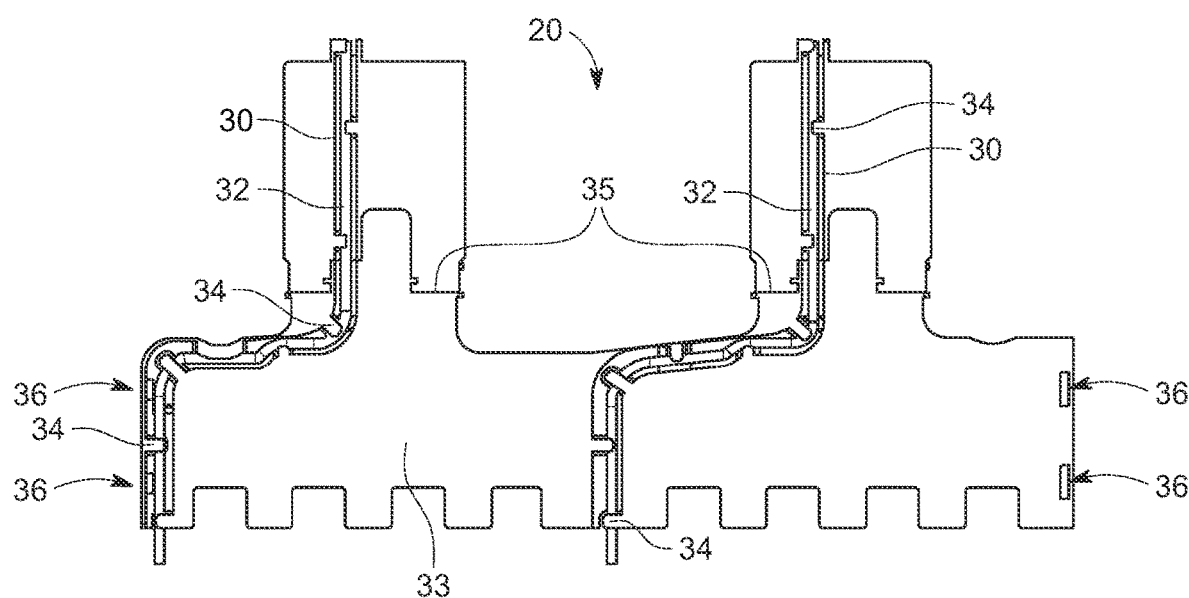
FIG. 3 is a top view of the air-duct module in FIG. 1.

FIG. 3 illustrates a top view of the air-duct module 20 from FIG. 1. The pair of cable-routing channels 30 are recessed into an upper wall 33 of the air-duct module 20. Each of the cable-routing channels 30 receives a corresponding cable 32. The cables 32 are retained within the cable-routing channels 30 by several clamping structures 34. In the illustrated embodiment, the clamping structures 34 extend from the upper wall 33 of the air-duct module 20 to a point that is partially within the cable-routing channels 30. The clamping structures 34 have some flexibility so that they can be manipulated by an operator as the cables 32 are inserted into the cable-routing channels 30 such they become positioned below the clamping structures 34. The clamping structures 34, which have the appearance of cantilevered tabs in the illustrated embodiment, may have different sizes and shapes that allow them to fit within their respective regions of the cable-routing channels 30. The air-duct module 20 may be a single, unitary molded structure or it could be comprised of multiple structures, as shown in FIG. 3, in which one structure of the air-duct module 20 is separated from and attached to the other structures at seams 35. When the air-duct module 20 is comprised of multiple structures, the upper wall 33 may be defined by separate walls from the multiple structures and the cable-routing channel 30 extends along and within the multiple structures.

FIG. 3 also illustrates four mounting regions for the air-duct module 20. A slot 36 is positioned in the mounting regions along the side of the air-duct module 20 according to one embodiment of the present disclosure. As shown best in FIGS. 4-5, the slots 36 are located in side surfaces of the air-duct module 20 that extend downwardly from the upper wall 33. Each of the slots 36 attaches the air-duct module 20 to the server chassis 12, as discussed in more detail below with reference to in FIGS. 7A and 7B.

Figure 4:
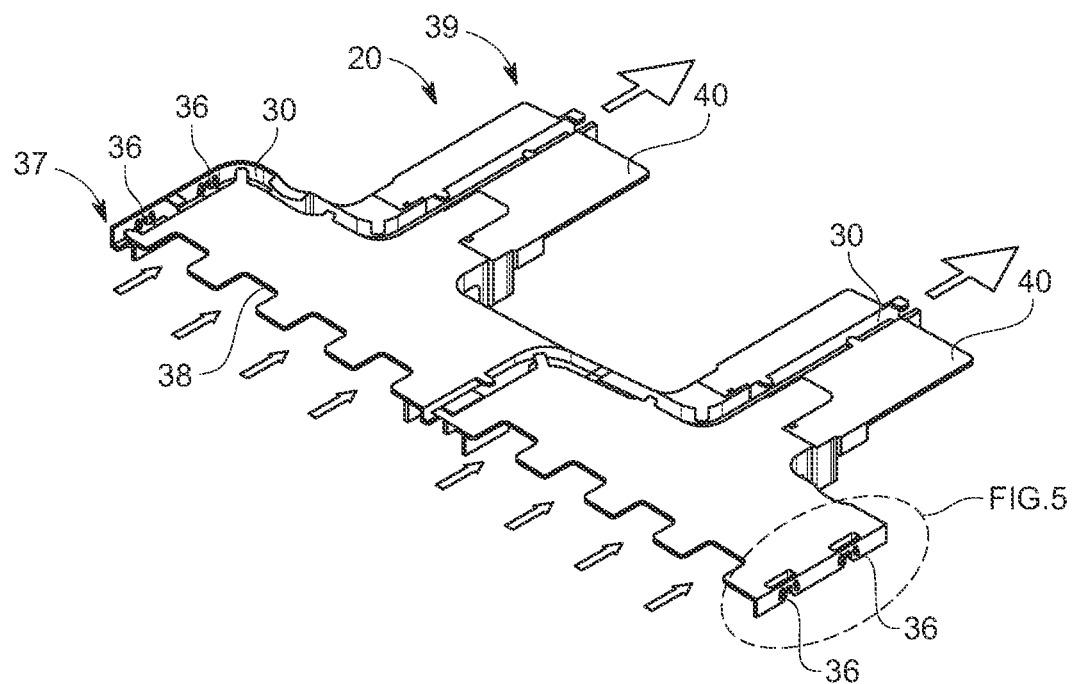
FIG. 4 is another perspective view of only the air-duct module in FIG. 1.
Figure 5:
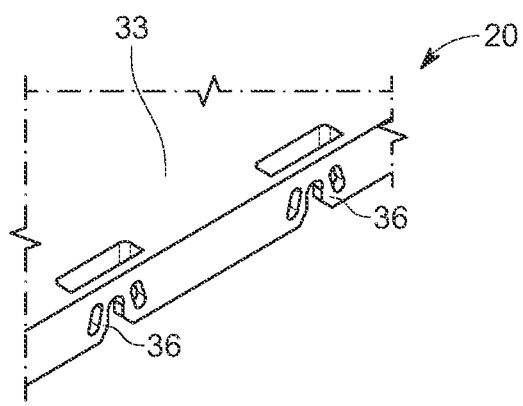
FIG. 5 is a detailed perspective view of the slot region of the air-duct module in FIG. 4 that is used for attaching the air-duct module to the server chassis.

FIG. 4 also schematically illustrate the flow of the air from each of the four fans in the two fan modules 22 (FIG. 1), which are depicted by the arrows. The air from the fans moves into the first end region 37 of the air-duct module 20 below the upper wall 33, as shown in FIG. 5. The first end region 37 includes a plurality of openings 38, each of which corresponds to a single fan such that an upper surface of the fan fits within its respective opening 38. Each of the openings 38 allows the respective fan to be removed and replaced (or repaired) without the need for removing the entire air-duct module 20 from the server 10 (FIG. 1).

The fans cause air to moved away from the first end region 37 and toward a second end region 39, which includes a pair of physically separated outlets 40 that are adjacent to the pair of heat exchangers 24 (FIGS. 1-2). As shown, the forced air from four fans exits from one outlet 40, while the forced air from the other four fans exits from the other outlet 40 at the second end region 39 of the air-duct module 20. After leaving the pair of outlets 40, the air continues traveling within the server and provides cooling to other electronics, before exiting from vents on the back side of the server chassis 12 (FIG. 1).

Figure 6:
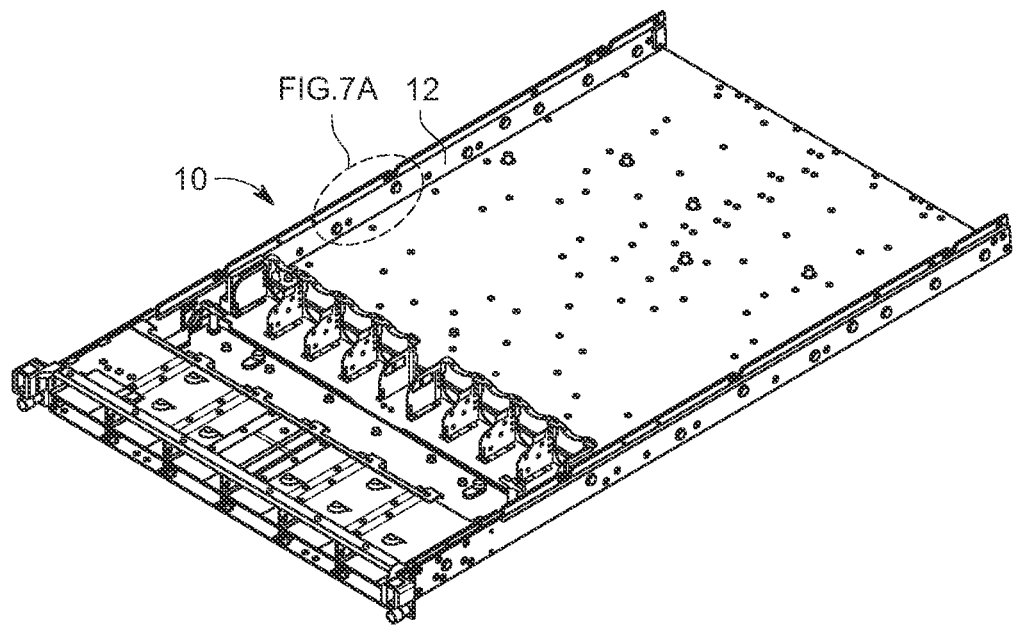
FIG. 6 is a perspective view of the server with the air-duct module and the fan modules removed so as to view the latch structures on the server chassis.
Figure 7A:
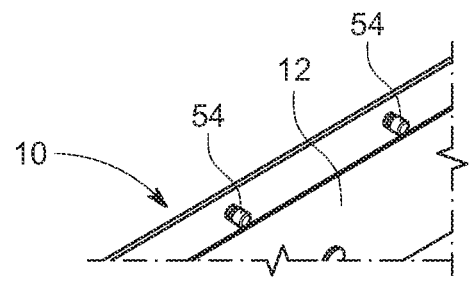
FIG. 7A is a detailed perspective view of the latch structures on the server chassis in FIG. 6.
Figure 7B:
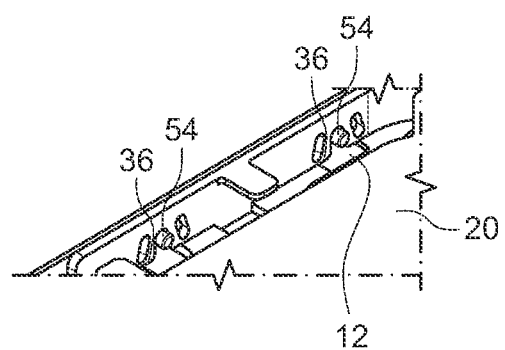
FIG. 7B illustrates the slots of the air-duct module of FIG. 5 mating with the latch structures on the server chassis of FIG. 7A.

FIGS. 6 and 7A illustrate one embodiment of an attachment mechanism within the chassis 12 of the server 10 that can be used with the air-duct module 20 described above. As shown best in FIG. 7A, the side walls of chassis 12 of the server 10 include latches 54 that protrude outwardly from the side walls of the chassis 12. As shown best in FIG. 7B, the slots 36 of the air-duct module 20 slide over and mate with the latches 54, creating a snap-fit attachment for the air-duct module 20. Other forms of attachment can be employed as well.

Figure 8:
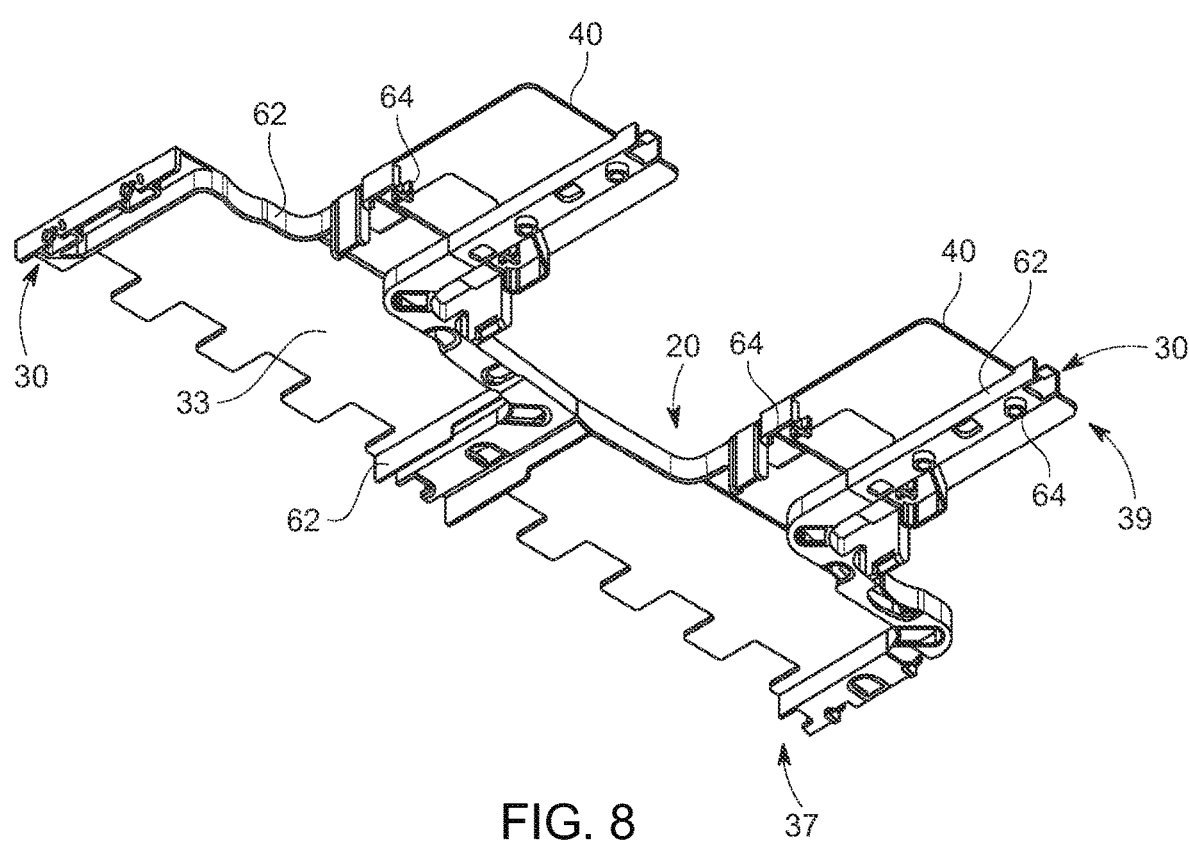
FIG. 8 is an underside perspective view of the air-duct module with integrated cable-routing channels, in accordance with one embodiment of the present disclosure.

FIG. 8 illustrates the underside of the air-duct module 20, which includes various side walls 62 extending downwardly from the upper wall 33. Like the upper wall, the side walls 62 help to guide the path of the air produced by the fan modules 22 (FIG. 1) from the first end region 37 to the second end region 39 where the air exits from the pair of outlets 40.

The cable-routing channels 30 are also located on the underside of the air-duct module 20. As illustrated in FIG. 8, the cable-routing channels 30 are generally U-shaped structures that are defined by several lower walls (including some of the side walls 62) below the upper wall 33 of the air-duct module 20. Thus, the passage for guiding air across the heated components within the air-duct module 20 (e.g., the heat exchangers 24 in FIGS. 1-2) is defined by the upper wall 33 and the side walls 62, and also may be partially defined by the lower walls defining the cable-routing channel 30. Though the underside view of FIG. 8 reveals a few openings in the air-duct module 20 that may be due to the manufacturability of the molded part, any openings can be closed with tape or Mylar if too much air leaks therefrom.

FIG. 8 also illustrates an array of support bosses 64 on the underside of the air-duct module 20 that serve to structurally support the air-duct module 20 on various components within the server 10 (FIG. 1). As shown in FIG. 8, several of the support bosses 64 are located on surfaces of the walls defining the cable-routing channel 30 or are adjacent to the cable-routing channel 30. The support bosses 64 transfer the forces associated with the cable-insertion process to structures below the air-duct module 20. Thus, when the cables 32 (FIG. 3) are forced into the cable-routing channels 30, there is less chance for the forces to cause distortion or damage to the air-duct module 20 because the air-duct module 20 is supported from the bottom along the length of the cable-routing channels 30.

Figure 9A:
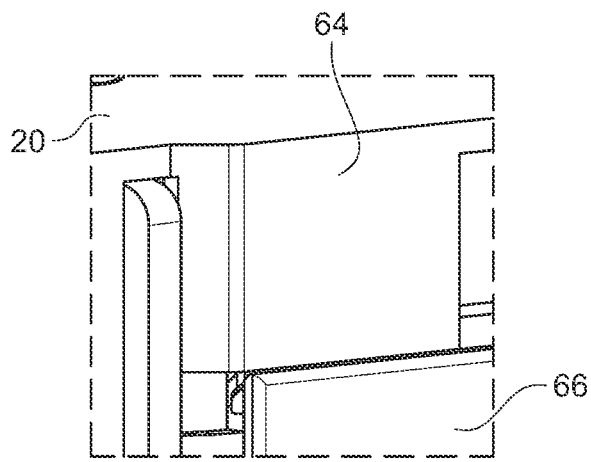
FIG. 9A illustrates one type of support boss on the underside of the air-duct module of FIG. 8.
Figure 9B:
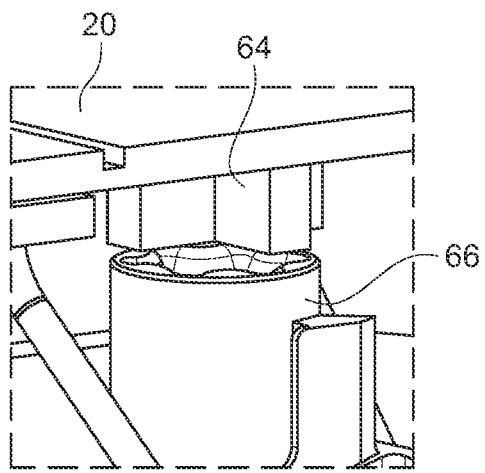
FIG. 9B illustrates another type of support boss on the underside of the air-duct module of FIG. 8.
Figure 9C:
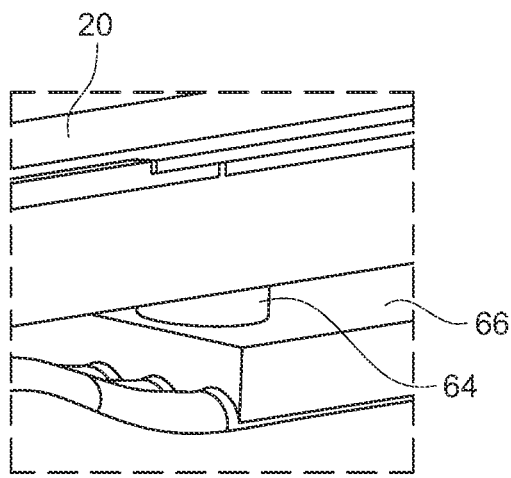
FIG. 9C illustrates a further type of support boss on the underside of the air-duct module of FIG. 8.

FIGS. 9A, 9B, and 9C illustrate different shapes and sizes of the support bosses 64 on the air-duct module 20, which may have a general rectangular shape in cross section (FIG. 9A), an X-shape or T-shape in cross section (FIG. 9B), or an annular or circular shape in cross-section (FIG. 9C). The lengths of the support bosses 64 may vary as well, as shown in FIGS. 9A, 9B, and 9C, depending on where they are located on the air-duct module 20. Further, the shapes and sizes of a lower component 66 that contacts the support bosses 64 may vary as well. The lower components 66 may be components within the chassis 12 of the server 10 (FIG. 1), such as a PCB or a structure or component on a PCB, or the lower components 66 can be part of the chassis 12 in some embodiments. The lower components 66 are selected as being ones that are structurally capable of receiving the manual forces associated with the cable-insertion process, as noted above.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. An air-duct module for a server, comprising:
   a main body having a first end region for receiving air from a fan module and a second end region for allowing the air to exit after moving across a heated component within the server, the main body having an upper wall extending between the first end region and the second end region and a plurality of side walls extending downwardly away from the upper wall; and
   a cable-routing channel located within the main body, the cable-routing channel being a generally U-shaped structure that is defined by a plurality of lower walls located below the upper wall, the cable-routing channel having an opening in the upper wall for receiving an electronics cable, the cable-routing channel extending from the first end region to the second end region of the main body, the cable-routing channel for receiving the electronics cable that is inserted into the opening from above the air-duct module and for holding the electronics cable adjacent to the plurality of lower walls at a position below the upper wall.

2. The air-duct module of claim 1, wherein the main body further includes a plurality of clamping structures located along the cable-routing channel for retaining the electronics cable within the cable-routing channel.

3. The air-duct module of claim 2, wherein the plurality of clamping structures includes tabs projecting from the upper wall and partially across the cable-routing channel.

4. The air-duct module of claim 1, wherein the main body is comprised of a plurality of separate structures, the upper wall being defined by walls from the separate structures and the cable-routing channel extending along the separate structures.

5. The air-duct module of claim 1, further including a second cable-routing channel for receiving a second electronics cable.

6. The air-duct module of claim 5, wherein the second end region includes two separated outlets for permitting air to exit the air-duct module, one of the two separated outlets includes the cable-routing channel and the other of the two separated outlets includes the second cable-routing channel.

7. The air-duct module of claim 5, wherein the second cable-routing channel extends between the first end region and the second end region.

8. The air-duct module of claim 5, wherein the second cable-routing channel is located within the upper wall.

9. The air-duct module of claim 1, further including a plurality of support bosses extending from the plurality of lower walls for engaging corresponding support structures within the server.

10. An air-duct module for a server, comprising:
a main body including an upper wall and a plurality of side walls extending downwardly away from the upper wall, the main body further including a plurality of channel walls extending from the upper wall and defining a cable-routing channel located within the main body, at least some of the plurality of channel walls including support bosses for engaging corresponding support structures within the server, the cable-routing channel for receiving an electronics cable that extends across the main body; and
an air passage for guiding air across a heat exchanger within the server, the air-duct passage being defined by the upper wall, the plurality of side walls, and at least some of the plurality of channel walls.

11. The air-duct module of claim 10, wherein the main body further includes a second plurality of channel walls defining a second cable-routing channel for receiving a second electronics cable.

12. The air-duct module of claim 10, wherein at least some of the channel walls extend downwardly away from the upper wall.

13. The air-duct module of claim 10, wherein the main body further includes a plurality of clamping structures located along the cable-routing channel for retaining the electronics cable within the cable-routing channel.

14. The air-duct module of claim 10, wherein the main body has a first end region for receiving air from one or more fans and a second end region for allowing air to exit the air duct module in two air paths, one of the two air paths extending across the heat exchanger and the other of the two air paths extending across a second heat exchanger.

15. A server, comprising:
a chassis having a base and side walls extending upwardly from the base;
electronics located within the chassis, at least one of the electronics being in direct thermal communication with a heat exchanger for removing heat from the at least one of the electronics;
at least one cable coupled to the electronics;
a fan module within the chassis for moving air across the heat exchanger; and
an air-duct module that defines an air passage that guides the air from the fan module and across the heat exchanger, the air-duct module including an integrated cable-routing channel that extends between a first end region near the fan module and a second end region near the heat exchanger, the first end region having a larger width dimension than the second end region such that a cross-sectional area of the air passage reduces between the first end region and the second end region, the integrated cable-routing channel including an opening in an upper wall of the air-duct module such that the at least one cable can be inserted into the integrated cable-routing channel from above the air-duct module, the at least one cable being located within the integrated cable-routing channel during operation of the server.

16. The server of claim 15, wherein the air-duct module includes a plurality of side walls extending downwardly away from the upper wall toward the chassis, the heat exchanger is partially enveloped by the upper wall and at least one of the plurality of side walls.

17. The server of claim 15, wherein the chassis includes a plurality of latches and the air-duct module includes a plurality of slots that mate with the plurality of latches for mounting the air-duct module to the chassis.

18. The server of claim 15, wherein the air-duct module further includes a plurality of support bosses in the region of the integrated cable-routing channel, the plurality of support bosses for engaging corresponding components mounted to the chassis or to the chassis itself.

19. An air-duct module for a server, comprising:
a main body having a first end region for receiving air from a fan module and a second end region for allowing the air to exit after moving across a heated component within the server, the main body having an upper wall extending between the first end region and the second end region and a plurality of side walls extending downwardly away from the upper wall;
a cable-routing channel located within the main body, the cable-routing channel for receiving an electronics cable that extends from the first end region to the second end region; and
wherein the main body is comprised of a plurality of separate structures, the upper wall being defined by walls from the separate structures and the cable-routing channel extending along the separate structures.

* * * * *